(12) United States Patent
Richter et al.

(10) Patent No.: US 8,722,511 B2
(45) Date of Patent: May 13, 2014

(54) REDUCED TOPOGRAPHY IN ISOLATION REGIONS OF A SEMICONDUCTOR DEVICE BY APPLYING A DEPOSITION/ETCH SEQUENCE PRIOR TO FORMING THE INTERLAYER DIELECTRIC

(75) Inventors: Ralf Richter, Dresden (DE); Peter Javorka, Radeburg (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 342 days.

(21) Appl. No.: 13/154,754

(22) Filed: Jun. 7, 2011

(65) Prior Publication Data

US 2012/0025318 A1 Feb. 2, 2012

(30) Foreign Application Priority Data

Jul. 30, 2010 (DE) .......................... 10 2010 038 746

(51) Int. Cl.
*H01L 21/76* (2006.01)
(52) U.S. Cl.
USPC .................................. 438/435; 257/E21.546
(58) Field of Classification Search
USPC ....................................................... 438/435
See application file for complete search history.

(56) References Cited

U.S. PATENT DOCUMENTS

| 5,780,348 | A | 7/1998 | Lin et al. ........................ 438/303 |
|---|---|---|---|
| 6,352,897 | B1 | 3/2002 | Sung ............................. 438/296 |
| 6,893,937 | B1 * | 5/2005 | Gu et al. ........................ 438/424 |
| 7,393,751 | B1 * | 7/2008 | Luo et al. ....................... 438/296 |
| 2007/0231983 | A1 * | 10/2007 | Shifren et al. ................. 438/197 |
| 2009/0039442 | A1 * | 2/2009 | Han et al. ....................... 257/384 |
| 2009/0294809 | A1 * | 12/2009 | Frohberg et al. .............. 257/288 |
| 2009/0321840 | A1 | 12/2009 | Pidin ............................. 257/369 |

FOREIGN PATENT DOCUMENTS

| DE | 102008026214 B3 | 1/2010 | ............ H01L 21/283 |
|---|---|---|---|
| WO | WO 2007/126909 A1 | 11/2007 | .......... H01L 21/8238 |

OTHER PUBLICATIONS

Translation of Official Communication from German Patent Office for German Patent Application No. 10 2010 038 746.0 dated Mar. 21, 2011.

* cited by examiner

*Primary Examiner* — Daniel Luke
(74) *Attorney, Agent, or Firm* — Amerson Law Firm, PLLC

(57) ABSTRACT

Contact failures in sophisticated semiconductor devices may be reduced by relaxing the pronounced surface topography in isolation regions prior to depositing the interlayer dielectric material system. To this end, a deposition/etch sequence may be applied in which a fill material may be removed from the active region, while the recesses in the isolation regions may at least be partially filled.

12 Claims, 9 Drawing Sheets

REDUCED TOPOGRAPHY IN ISOLATION REGIONS OF A SEMICONDUCTOR DEVICE BY APPLYING A DEPOSITION/ETCH SEQUENCE PRIOR TO FORMING THE INTERLAYER DIELECTRIC

BACKGROUND OF THE INVENTION

1. Field of the Invention

The present disclosure generally relates to the field of semiconductor manufacturing, and, more particularly, to forming contact levels having a dielectric material system that comprises at least one highly stressed material.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a semiconductor layer. Due to the high number of circuit elements and the required complex layout of modern integrated circuits, the electrical connections of the individual circuit elements may generally not be established within the same level on which the circuit elements are manufactured, but require a plurality of additional "wiring" layers, which are also referred to as metallization layers. These metallization layers generally include metal-containing lines, providing the inner-level electrical connection, and also include a plurality inter-level connections, which are also referred to as "vias," that are filled with an appropriate metal and provide the electrical connection between two neighboring stacked metallization layers.

Furthermore, the circuit elements are typically embedded in a dielectric material system, which provides the desired degree of passivation and robustness of the circuit elements prior to forming the complex metallization system. Hence, an appropriate contact regime or contact structure is implemented in the dielectric material system that passivates the circuit elements and that will be also referred to herein as an interlayer dielectric material. Due to the continuous shrinkage of the critical dimensions of the circuit elements and thus due to the reduced lateral pitch of closely spaced circuit elements, the contact structure of the semiconductor device, which may be considered as an interface connecting the circuit elements of the device level with the metallization system, has to be adapted to the reduced feature sizes in the device level and the metallization system. For this reason, very sophisticated patterning strategies may have to be applied in order to provide the contact elements with the required density and with appropriate reduced dimensions, at least at the device level side, in order to appropriately connect to the contact regions, such as drain and source regions, gate electrode structures and the like, without contributing to pronounced leakage current paths and even short circuits and the like. In many conventional approaches, the contact elements or contact plugs are typically formed by using a tungsten-based metal together with an interlayer dielectric stack that is typically comprised of silicon dioxide in combination with an etch stop material, such as a silicon nitride material. Due to the very reduced critical dimensions of the circuit elements, such as the transistors, the respective contact elements have to be formed on the basis of contact openings with an aspect ratio which may be as high as approximately 8:1 or more, wherein a diameter of the contact openings may be 0.1 μm or significantly less for transistor devices of, for instance, the 65 nm technology node. In even further sophisticated approaches, and in very densely packed device regions, the width of the contact openings may be 50 nm and less.

In recent developments, the contact level of sophisticated semiconductor devices may also be used for implementing additional mechanisms for enhancing performance of the transistor elements by inducing a desired type of strain in the active regions of the transistors. It is well known that, for a given crystallographic configuration of the active regions of the transistors, the generation of a specific type of strain, at least in the channel region, may have a significant effect on the resulting charge carrier mobility, i.e., on electrons or holes, thereby providing the possibility of increasing the drive current capability and the switching speed of the transistors for otherwise given transistor parameters. For example, for a standard configuration of a silicon material, i.e., a silicon material having a surface in the form of a (100) equivalent crystal plane with the current flow direction of the channel region oriented along a <110> equivalent crystallographic axis, a compressive strain may result in a significant increase of the mobility of holes, thereby enabling improvement in performance of P-channel transistors. Similarly, the generation of a tensile strain component in the channel region may result in an increase of the electron mobility, thereby providing superior performance of N-channel transistors. Since a strained silicon material in the channel region of field effect transistors may be considered as a "new" type of semiconductor material, without actually requiring new base materials and also allowing the application of many well-established process techniques, great efforts have been made in order to develop strain-inducing mechanisms with a high degree of compatibility with conventional transistor configurations.

One promising approach that is frequently applied in sophisticated semiconductor devices is the incorporation of a highly stressed dielectric material into the interlayer dielectric material system, since at least the lower part of this material system is in close proximity to the gate electrode structures and the active region of the transistors, thereby enabling an efficient transfer of stress forces into the active region in order to create the desired strained state therein. As previously discussed, in a conventional interlayer dielectric material system, typically, an etch stop material, for instance provided in the form of a silicon nitride material, may be applied in combination with the actual interlayer dielectric material, for instance in the form of a silicon dioxide material, thereby enabling the complex patterning sequence for forming contact openings having the desired reduced lateral dimensions, as explained above. Consequently, at least the etch stop material may be positioned in close proximity to the transistors and thus may represent an efficient source of creating a desired type of strain in at least some of the transistors. Therefore, in many approaches, the silicon nitride material of the etch stop layer may be formed so as to have a high internal stress level, which may then be efficiently transferred into the active region and may thus finally result in a desired type of strain in the channel region. For example, plasma enhanced chemical vapor deposition (CVD) techniques have been developed in which process parameters are selected such that compressive stress levels of up to 3 GPa or even higher or tensile stress levels of up to 2 GPa and higher may be obtained. Since the internal stress level of the silicon nitride material, in combination with the amount of material, i.e., the thickness of the etch stop layer, may significantly affect the finally obtained strain in the channel region, generally, the process parameters are targeted so as to produce very high internal stress levels since the layer thickness is typically restricted by the complex surface topography in sophisticated semiconductor devices. For example, in densely packed device areas, gate electrode structures of minimum lateral dimensions may have to be positioned in close proximity to each other, thereby actually requiring deposition techniques with superior gap filling capabilities in order to reliably fill the spaces between the closely spaced gate electrode structures without creating deposition-related irregularities. It turns out, however, that desired high stress levels and superior gap filling capabilities upon depositing the silicon nitride material may not be compatible according to presently available deposition recipes so that corresponding irregularities may be generated, in particular in critical device areas having a very pronounced surface topography, wherein these irregularities may interact with the complex patterning process for forming contact elements, thereby resulting in significant yield losses of sophisticated semiconductor devices, as will be described in more detail with reference to FIGS. 1a-1e.

FIG. 1a schematically illustrates a cross-sectional view of a semiconductor device 100 in an advanced manufacturing stage. As illustrated, the device 100 comprises a substrate 101, above which is provided a semiconductor layer 102, such as a silicon layer, which may form a bulk configuration or a silicon-on-insulator (SOI) configuration in combination with the substrate 101. That is, a bulk configuration is to be understood as a device architecture in which a crystalline semiconductor material of the substrate 101 may be in direct contact with the semiconductor layer 102, in and above which circuit elements, such as transistors, are to be formed. On the other hand, an SOI architecture is to be understood as a device configuration in which a buried insulating layer (not shown) may be formed below the semiconductor layer 102, thereby vertically bordering the semiconductor layer 102. Furthermore, in the manufacturing stage shown, the semiconductor layer 102 may not represent a continuous semiconductor material but may be divided into a plurality of active regions that are laterally delineated by an isolation region 102I, which may be substantially comprised of silicon dioxide and the like. An active region is to be understood as a semiconductor region in and above which at least one transistor is to be provided. For convenience, in FIG. 1a, a single active region 102A is illustrated, in and above which a plurality of transistors 150 are formed.

The transistors 150 comprise closely spaced gate electrode structures 120A, 120B which may have any appropriate configuration as required by the overall device architecture of the device 100. For example, as illustrated, the gate electrode structures 120A, 120B may comprise a gate dielectric material 122, such as a silicon oxide-based material, possibly in combination with a high-k dielectric material, which is to be understood as a dielectric material having a dielectric constant of 10.0 or higher, and the like. Moreover, an electrode material 121, such as a metal-containing electrode material, a semiconductor material and the like, is typically provided, possibly in combination with a further electrode material 123, for instance provided in the form of a metal silicide material. Moreover, a sidewall spacer structure 124, which may comprise two or more individual spacer elements in combination with etch stop liners (not shown), may be provided on sidewalls of the electrode materials 121 and 123. As discussed above, the gate electrode structures 120A, 120B may have a length that is well beyond 100 nm, such as 50 nm and less in very sophisticated semiconductor devices. The gate length of the structures 120A, 120B is to be understood as the horizontal extension of the electrode material 121.

Moreover, the transistors 150 may comprise drain and source regions 151 having any appropriate dopant concentration and profile as required by the general transistor characteristics. Furthermore, contact areas 152 may be provided in the drain and source regions 151, for instance in the form of a metal silicide and the like. Moreover, a channel region 153 is provided between the drain and source regions 151 and has a length that is substantially determined by the length of the gate electrode structures 120A, 120B and the horizontal dopant profile of the drain and source regions 151. As discussed above, the generation of a certain type of strain in the channel region 153 may significantly increase the conductivity thereof, thereby contributing to a superior performance of the transistors 150. For example, when the transistors 150 represent P-channel transistors, a compressive strain in the channel region 153, for instance along the current flow direction, i.e., along the horizontal direction in FIG. 1a, may provide a superior drive current capability of the transistors 150. To this end, a dielectric material 132, such as a silicon nitride material, is frequently provided so as to have a high internal stress level which may act on the gate electrode structures 120A, 120B and the active region 102A, thereby creating a desired type of strain in the channel region 153.

FIG. 1b schematically illustrates a cross-sectional view of the semiconductor device 100 in a device area that is laterally offset from the active region 102A of FIG. 1a. In the example shown, it may be assumed that the gate electrode structures 120A, 120B extend laterally beyond the active region 102A so that a portion thereof is formed on or above the isolation region 102I. Thus, the gate electrode structures 120A, 120B may have substantially the same configuration as described with reference to FIG. 1a, except for any differences caused by the different nature of the material of the isolation region 102I and the more pronounced surface topography created therein due to the preceding manufacturing sequence for forming the semiconductor device 100. As illustrated pronounced recesses, as indicated by 102R, are formed in the isolation structure 102I which may be significantly more pronounced compared to any recessing in the active region 102A. Consequently, due to the very pronounced surface topography caused by the recesses 102R, the dielectric layer 132 may frequently comprise deposition-related irregularities, such as a void 132V, which may significantly affect the further processing of the device 100, as will be described later on in more detail.

FIG. 1c schematically illustrates a top view of the semiconductor device 100 according to the manufacturing stage as shown in FIGS. 1a and 1b. As illustrated, the active region 102A may be laterally delineated by the isolation region 102I, which in turn may laterally delineate a further active region 102B, as is also previously explained. The active regions 102A, 102B may correspond to transistors of the same conductivity type or to transistors of different conductivity type, depending on the circuit layout of the device 100. Moreover, in the example shown, it may be assumed that the gate electrode structures 120A, 120B may extend across the active region 102A, across a portion of the isolation region 102I and into or across the active region 102B. As indicated, the cross-section as shown in FIG. 1a may correspond to the section as indicted by Ia, while the cross-section of FIG. 1b may correspond to the section of the isolation region 102I, indicated by Ib. Consequently, in some cases, the void 132V may extend along the isolation region 102I from the active region 102A to the active region 102B.

The semiconductor device as shown in FIGS. 1a-1c may be formed on the basis of the following process strategies. The isolation region 102I is typically provided by applying sophisticated lithography techniques for forming appropriate trenches or recesses in the semi-conductor layer 102 (FIG. 1a) and refilling the recesses with an appropriate dielectric material, such as silicon dioxide. Thereafter, any excess material may be removed, for instance by chemical mechanical polishing (CMP) and etch techniques, and appropriate implantation processes in combination with masking regimes are applied in order to incorporate any desired well dopant species into the active regions 102A, 102B (FIG. 1c). Next, an appropriate material system is provided for the gate electrode structures 120A, 120B, which may be accomplished on the basis of superior oxidation, deposition and patterning strategies, depending on the complexity of the resulting gate layer stack. For example, silicon oxide-based materials may be formed by oxidation and/or deposition while any high-k dielectric materials, possibly in combination with conductive cap materials, may be provided on the basis of sophisticated deposition techniques, such as atomic layer deposition (ALD), CVD, sputter deposition and the like. Similarly, silicon material or any other semiconductor material may be provided by CVD techniques in combination with any additional materials, such as dielectric cap materials (not shown), hard mask materials and the like. Thereafter, a complex patterning sequence is applied in order to pattern the electrode materials 121 and possibly any other additional materials so as to have the desired critical dimensions, which may be 100 nm and significantly less, such as 50 nm and less. Thereafter, a portion of the spacer structure 124 may be formed and drain and source dopant species may be incorporated into the active regions 102A, 102B as required. Thereafter, the spacer structure 124 may be completed and any additional drain and source dopant implants may be introduced, followed by any anneal processes, in order to adjust the final horizontal and vertical dopant profile and to reduce implantation-induced damage. Next, the contact areas or metal silicide regions 152 may be formed, if required, for instance by depositing a refractory metal, such as nickel, platinum and the like, and initiating a chemical reaction to obtain the desired metal silicide. In this stage, the metal silicide 123 may also be provided in the gate electrode structures 120A, 120B.

It should be appreciated that, during the entire complex process sequence, a plurality of sophisticated cleaning processes and etch processes are required, which may result in a more or less pronounced loss of materials in the active regions 102A, 102B and in a more pronounced manner in the isolation region 102I. For example, before and/or after any critical processes, typically, efficient cleaning recipes may have to be applied, wherein frequently chemistries, such as hydrofluoric acid and the like, may be applied in order to remove contaminants and the like. In any such reactive processes, a significant portion of material of the isolation region 102I may also be removed, thereby increasingly contributing to the pronounced recesses 102R (FIG. 1b). For example, also prior to forming the metal silicide regions 152 (FIG. 1a), a pronounced cleaning process may be required in order to prepare exposed surface portions of the active regions 102A, 102B (FIG. 1c) for the subsequent silicidation process. Moreover, in many sophisticated approaches, additional strain-inducing mechanisms are implemented, for instance by providing a strain-inducing semiconductor material (not shown) in a portion of active regions, for instance by providing a silicon/germanium material in the drain and source areas of the transistors, so that the strained silicon/germanium material may also apply a desired compressive strain in the channel region. Also in this case, additional etch and cleaning processes are required, which may result in an even more pronounced surface topography of the isolation region 102I, when laterally delineating the active region of P-channel transistors.

Consequently, upon depositing the dielectric material 132 with a high internal stress level, typically process parameters are selected such that a desired high amount of material may be positioned on the active region 102A (FIG. 1a) and thus also between the closely spaced gate electrode structures 120A, 120B. In this case, the deposition process for forming the layer 132 may result in the void 132V (FIG. 1b) between the gate electrode structures 120A, 120B above the isolation region 102I due to the pronounced recess 102R, since a significantly increased aspect ratio is "seen" by the deposition process locally above the isolation structure 102I.

FIG. 1d schematically illustrates the semiconductor device 100 in a further advanced manufacturing stage. As illustrated, a further dielectric material 133, for instance in the form of a silicon dioxide material, is provided, thereby forming, in combination with the layer 132, an interlayer dielectric material system 130. Furthermore, a contact element 131 is formed in the system 130 so as to connect to the active regions 102A and/or 102B by connecting to the contact area 152. The material 133 may typically be provided on the basis of well-established deposition techniques, such as high density plasma, CVD, sub-atmospheric CVD and the like, in order to provide the material 133 with the required chemical and mechanical characteristics, while these deposition techniques may also provide high deposition rates and superior gap filling behavior. After the deposition of the material 133, the surface thereof may be planarized, for instance by CMP, in order to provide superior conditions for the subsequent complex patterning strategy for forming the contact element 131. To this end, an appropriate etch mask may be formed on the basis of sophisticated lithography techniques, which may involve the deposition of hard mask materials and the like, followed by a complex etch step for etching through the material 133, while using the material 132 as an etch stop material. Thereafter, a different etch chemistry may be applied so as to etch through the layer 132 to connect to the area 152. Thereafter, appropriate deposition recipes may be applied so as to fill the contact opening with an appropriate contact metal, such as tungsten, followed by the removal of any excess material, for instance by CMP, thereby providing the electrically isolated contact element 131. The deposition of the tungsten material may typically be accomplished on the basis of CVD techniques, possibly in combination with the deposition of appropriate barrier and seed materials, wherein, however, a significant deposition may also occur in the void 132v (FIG. 1c) when the preceding process for forming the contact opening may also result in connecting to the void 132V. For example, by a slight misalignment of the contact openings, the void 132V may extend into the active regions 102A, 102B and a "buried" channel is created which may be filled, at least partially, with the contact material upon filling the contact openings.

FIG. 1e schematically illustrates a top view of the semiconductor device 100 according to a manufacturing stage as shown in FIG. 1d. As illustrated, the contact elements 131 may be provided in the active regions 102A, 102B, wherein also the void 132V may have incorporated therein a conductive material, thereby creating a leakage path, which may even result in a short circuit of the active regions 102A and 102B. Consequently, by applying the manufacturing strategy as described above, a significant probability may exist to form unwanted leakage paths caused by the interlayer dielectric material system 130 (FIG. 1d), which may result in significant yield loss, in particular when highly scaled semiconductor devices are considered. The situation becomes even worse when even more sophisticated approaches are used for implementing strain-inducing mechanisms into the interlayer dielectric material system 130, for instance by applying layers of different types of stresses in order to selectively improve performance of N-channel transistors and P-channel transistors, thereby requiring the deposition of one or more additional stressed material layers and the removal of any unwanted portions thereof, which may contribute to even more pronounced patterning related irregularities. Consequently, a plurality of modifications has been proposed in order to reduce the significant risk of creating contact failures. For example, it has been proposed to provide the material layer 132 (FIGS. 1*a*, 1*b*) with superior gap filling capability in order to avoid any deposition related irregularities which, however, may result in a significant drop of the internal stress level according to presently available deposition recipes. Similarly, the reduction of the layer thickness may be associated with a significant reduction of the finally obtained strain level.

In other approaches, a thin dielectric liner material is provided in the contact openings prior to the deposition of the contact metal in an attempt to "seal" the contact openings with respect to any buried channels in the interlayer dielectric material. It appears, however, that a reliable sealing of the contact openings may require a significant thickness of the liner material which, however, may result in a degradation of the overall conductivity of the contact elements, in particular if critical lateral dimensions of 50 nm and less are to be implemented. In still further approaches, it may be attempted to identify the corresponding reactive process steps in which a significant loss of material in the isolation structure 102I is created and to provide alternative process recipes, which, however, may be difficult to achieve since usually any alternative cleaning recipes may suffer from a reduced efficiency, thereby contributing to an increased defect rate in earlier manufacturing stages.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which topography related irregularities are addressed when forming an interlayer dielectric material system which may include one or more strain-inducing dielectric materials. To this end, the pronounced surface topography in isolation regions may be selectively reduced at any appropriate manufacturing stage by providing an appropriate fill material, which may at least reduce the depth of the corresponding recesses in the isolation structure. Consequently, the processing may be continued with a less pronounced surface topography, thereby achieving a significantly reduced probability of creating deposition related irregularities upon forming one or more material layers of the interlayer dielectric material system. In some illustrative embodiments disclosed herein, the reduced surface topography may be obtained on the basis of a non-masked etch process by taking advantage of the increased aspect ratio caused by the recesses in the isolation structures. In still other illustrative embodiments disclosed herein, the provision of the fill material may be combined with any deposition and etch sequence, as may be required for other circuit features, such as spacer elements of sidewall spacer structures, thereby providing a very efficient overall manufacturing flow.

One illustrative method disclosed herein relates to forming a semiconductor device. The method comprises forming a dielectric material layer above a semiconductor region and an isolation region, wherein the semiconductor region and the isolation region have formed thereon one or more conductive lines, and the isolation region comprises recesses. The method further comprises performing a removal process so as to remove the dielectric material layer at least from above a portion of the semiconductor region and to preserve a part of the dielectric material layer in the recesses of the isolation region. Additionally, the method comprises forming an interlayer dielectric material system above the semiconductor region and the isolation region after performing the removal process.

A further illustrative method disclosed herein comprises performing a process sequence so as to form a plurality of gate electrode structures of a semiconductor device above a semiconductor region and an isolation region, wherein the process sequence results in a plurality of recesses due to material loss in exposed areas of the isolation region. The method further comprises forming a dielectric fill material above and between the plurality of gate electrode structures. Moreover, a portion of the dielectric fill material is removed from the semiconductor region and the isolation region so as to remove the dielectric fill material at least from a portion of the semiconductor region and to preserve a part of the dielectric fill material in the recesses in the isolation region. Additionally the method comprises forming an interlayer dielectric material system above the semiconductor region and the isolation region.

One illustrative semiconductor device disclosed herein comprises a plurality of gate electrode structures formed on a semiconductor region and a plurality of conductive line structures formed on an isolation region. The semiconductor device further comprises a dielectric fill material provided in recesses that are formed in the isolation region laterally adjacent to each of the plurality of conductive line structures. Furthermore, the semiconductor device comprises an interlayer dielectric material system formed above the semiconductor region and the isolation region.

BRIEF DESCRIPTION OF THE DRAWINGS

The disclosure may be understood by reference to the following description taken in conjunction with the accompanying drawings, in which like reference numerals identify like elements, and in which.

Figure 1A:
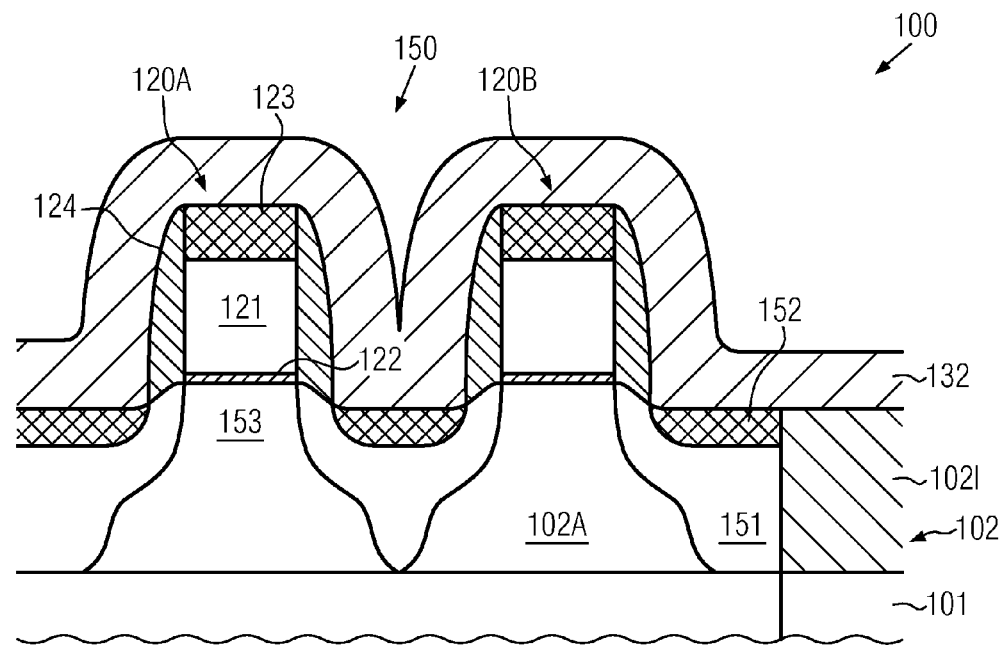
FIGS. 1*a* and 1*b* schematically illustrate cross-sectional views of a semiconductor device with gate electrode structures formed above an active region (FIG. 1*a*) and above an isolation region (FIG. 1*b*), according to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally addresses the problem of pronounced surface topography in isolation regions of sophisticated semiconductor devices by providing a fill material selectively in the isolation regions in order to reduce a depth of the recesses that have been created during the preceding processing of the semiconductor device. Consequently, based on the concept of the present disclosure, any well-established process strategy may be applied for forming sophisticated semiconductor devices which may result in a pronounced material loss in the isolation structures. The material loss, however, may at least be partially compensated for by providing a fill material at any appropriate manufacturing stage, for instance, after any material loss causing treatments and prior to the deposition of the interlayer dielectric material, while, in other illustrative embodiments, a corresponding process sequence may be applied in any previous manufacturing stages. In other cases, the refilling of any recesses may be applied twice or more times during the overall process flow prior to actually forming the interlayer dielectric material system, thereby providing superior process uniformity during the entire manufacturing sequence. In other illustrative embodiments, the provision of the fill material selectively in the isolation structures may be performed as a deposition and etch process as required for forming regular circuit components, such as sidewall spacer elements and the like. In this manner, additional process steps for reducing the depth of the recesses in the isolation region may be avoided.

The reduction of the surface topography selectively in the isolation regions may thus be advantageously applied to sophisticated interlayer dielectric material systems in which typically deposition related or patterning related irregularities may be created, in particular device areas such as isolation regions above which closely spaced conductive line structures or gate electrode structures are to be provided. For example, one or more strain-inducing dielectric material layers may be implemented into the interlayer dielectric material system, thereby providing superior strain efficiency for a given high production yield, while, on the other hand, for a desired target strain condition in the transistor elements, a significantly increased production yield may be accomplished compared to conventional strategies, as are for instance described above with reference to FIGS. 1a-1e.

With reference to FIGS. 2a-2i, further illustrative embodiments will now be described in more detail, wherein reference may also be made to FIGS. 1a-1e, if appropriate.

Figure 1B:
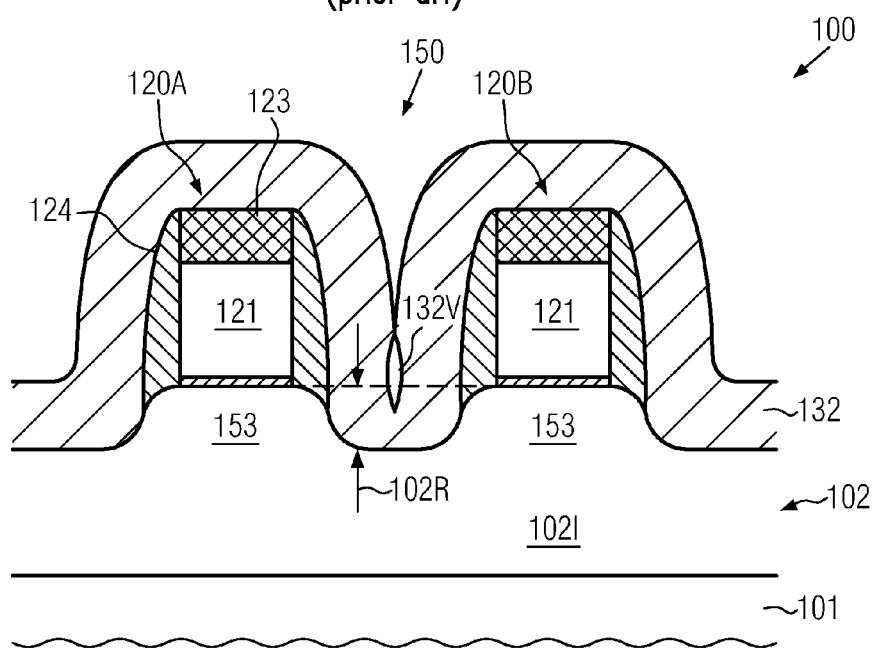
Figure 1C:
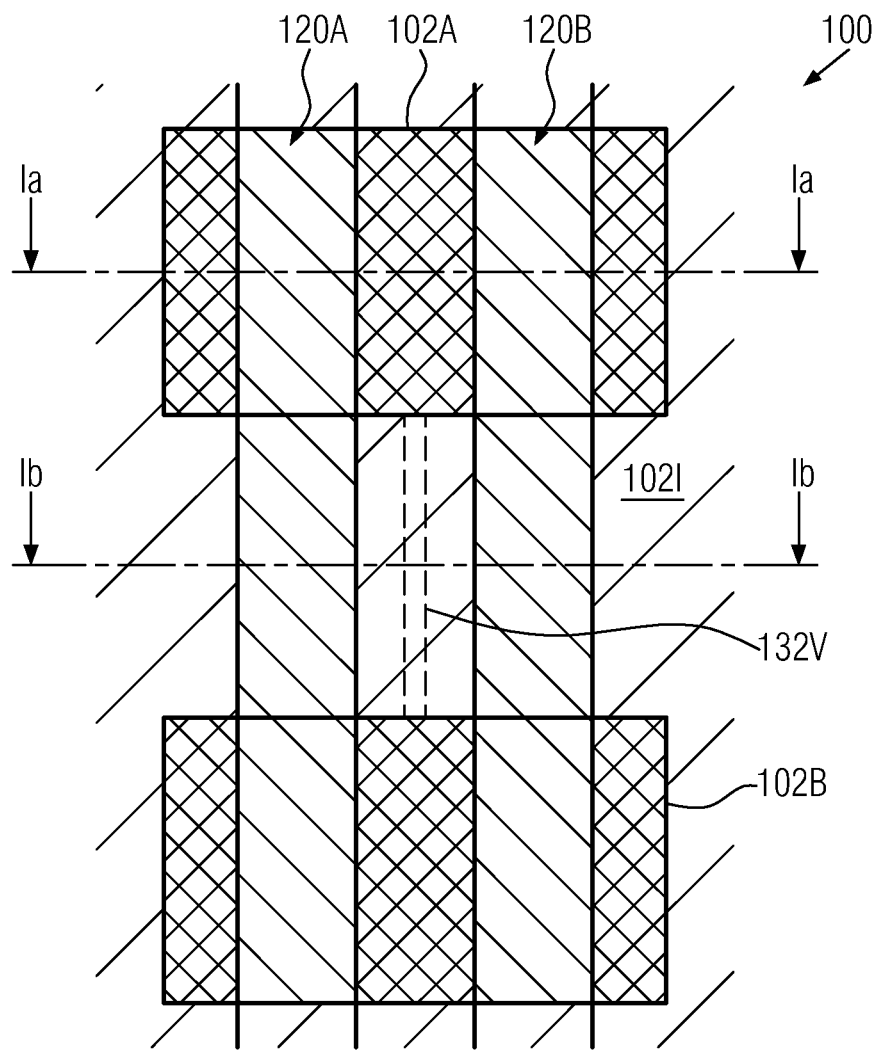
FIG. 1*c* schematically illustrates a top view of the semiconductor device shown in FIGS. 1*a* and 1*b*.
Figure 1D:
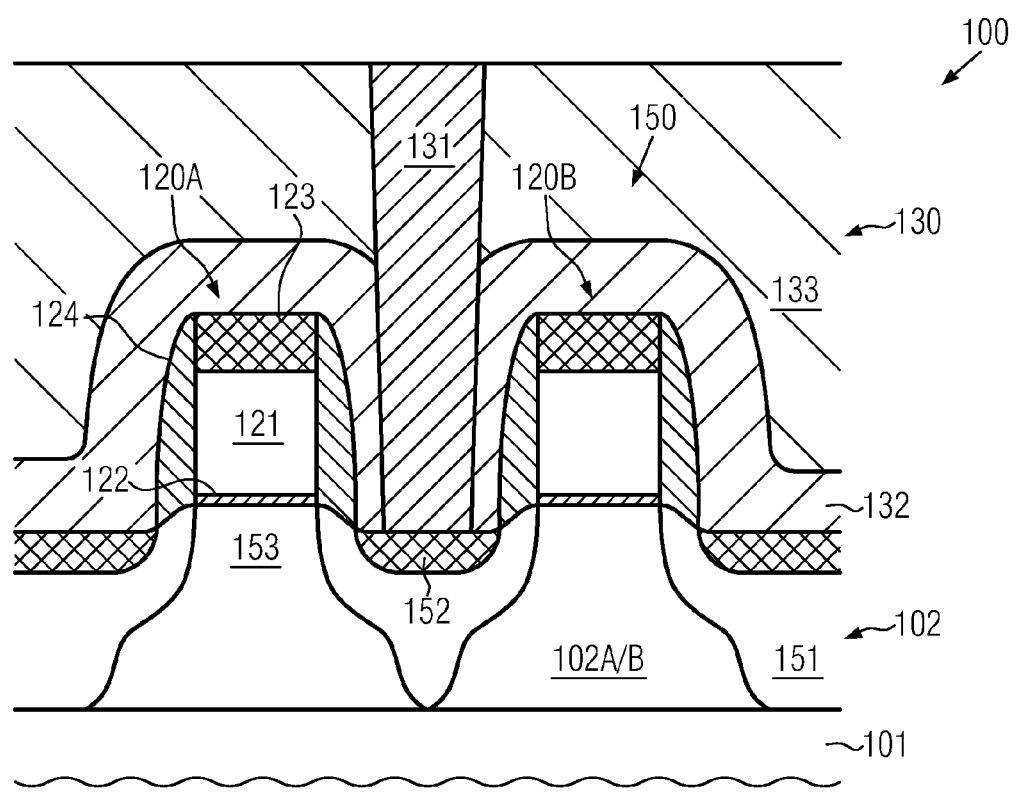
FIG. 1*d* schematically illustrates a cross-sectional view of the semiconductor device in a further advanced manufacturing stage comprising a contact element.
Figure 1E:
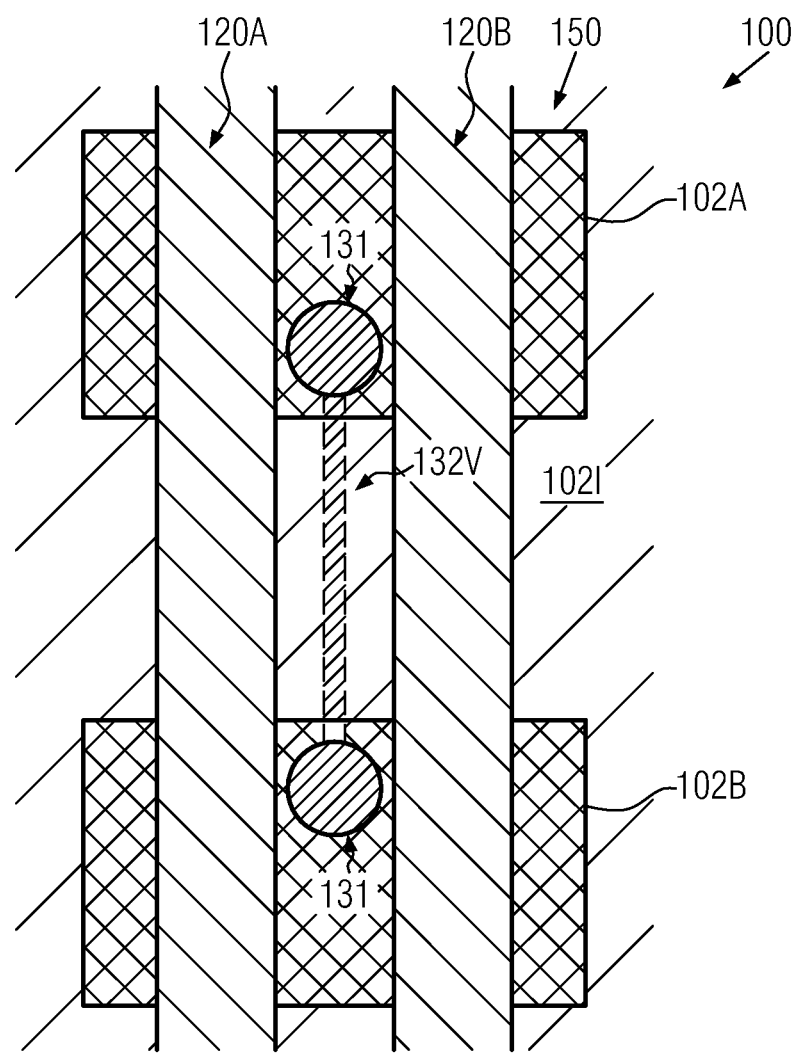
FIG. 1*e* schematically illustrates a top view of the semiconductor device according to a manufacturing stage as shown in FIG. 1*d*, wherein a high risk for creating leakage paths between adjacent contact elements exists, according to conventional process strategies.
Figure 2A:
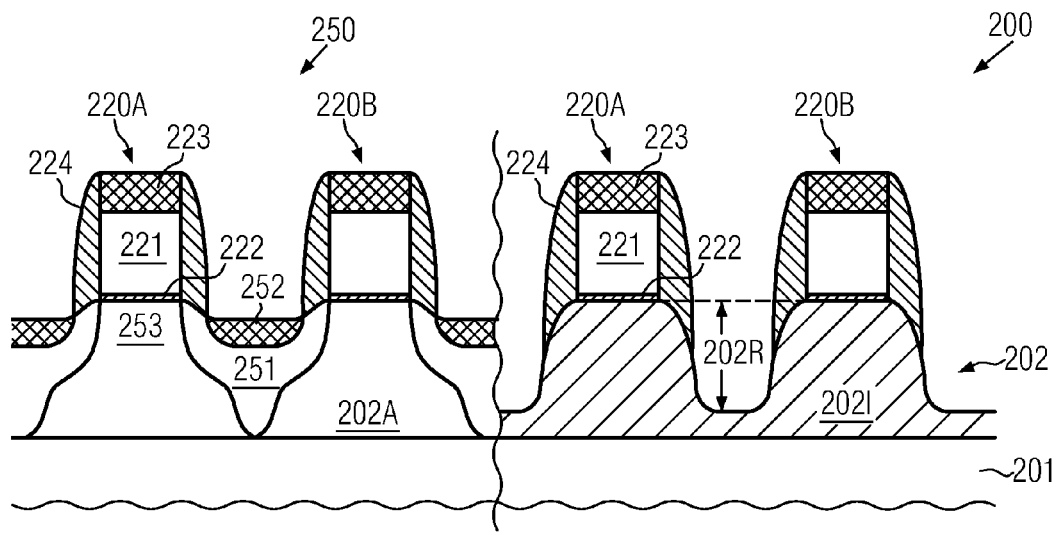
FIGS. 2a-2c schematically illustrate cross-sectional views of a semiconductor device during various manufacturing stages in providing a fill material for reducing the surface topography in the isolation region so as provide superior process conditions for forming an interlayer dielectric material system, according to illustrative embodiments.

FIG. 2a schematically illustrates a cross-sectional view of a semiconductor device 200. The device 200 may comprise a substrate 201 in combination with a semiconductor layer 202, in which may be provided an isolation region 202I, which may laterally delineate a plurality of semiconductor regions or active regions, wherein, for convenience, a single active region 202A is illustrated in FIG. 2a. Furthermore, the substrate 201 and the semiconductor layer 202 may represent a bulk configuration or an SOI configuration, as is also described above with reference to the semiconductor device 100. Furthermore, it should be appreciated that the cross-section of FIG. 2a may be taken through the active region 202A and the isolation region 202I at two different lateral positions. For example, the cross-section of the active region 202A may represent a section as is, for instance, indicated in FIG. 1c by Ia, while the section of the isolation region 202I may correspond to a lateral position as indicated by the section line Ib in FIG. 1c. It should be appreciated, however, that in other cases a cross-section of the device 200 as shown in FIG. 2a may represent a single section along a single position in a direction perpendicular to the drawing plane of FIG. 2a. In the manufacturing stage shown, transistors 250 may be formed in and above the active region 202A and may comprise gate electrode structures 220A, 220B that may have any appropriate configuration. For example, the gate electrode structures 220A, 220B may have a similar configuration as is previously described with reference to the gate electrode structures 120A, 120B of the device 100. For example, the structures 220A, 220B may comprise a gate dielectric material 222, an electrode material 221, possibly in combination with a further electrode material 223, and a sidewall spacer structure 224. Similarly, the transistors 250 may comprise drain and source regions 251 in combination with contact areas 252, such as metal silicide regions, and a channel region 253. Similarly, conductive line structures may be formed on the isolation region 202I, wherein for the device configuration shown in FIG. 2a, which may basically correspond to the configuration as shown in FIG. 1c, the conductive line structures may correspond to a portion of the gate electrode structures 220A, 220B and hence these conductive line structures may also be referred to as gate electrode structures. Hence, the structures 220A, 220B formed on the isolation region 202I may have basically the same configuration as the structures 220A, 220B as formed on the active region 202A, except for any modifications caused by the pronounced recessing in the isolation structure 202I. That is, as previously explained with reference to the semiconductor device 100, the process sequence for forming the semiconductor device 200 may have resulted in recesses 202R within the isolation structure 202I, which may be significantly more pronounced compared to any degree of recessing caused in the active region 202A.

The semiconductor device 200 as illustrated in FIG. 2a may be formed on the basis of similar process strategies as are previously discussed with reference to the semiconductor device 100 when referring to FIGS. 1a-1c. Consequently, the gate electrode structures 220A, 220B may be provided with critical dimensions of 100 nm and significantly less, such as 50 nm and less, thereby contributing to a very pronounced surface topography, in particular in the isolation region 202I.

Figure 2B:
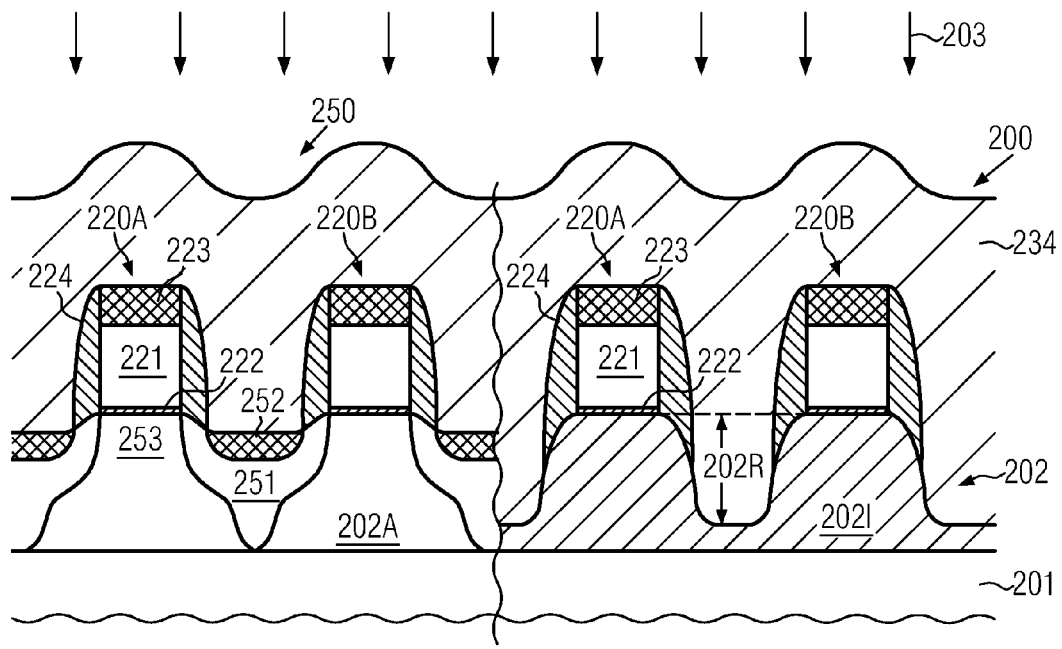

FIG. 2b schematically illustrates the device 200 with a dielectric fill material 234 formed above the active region 202A and the isolation region 202I. The dielectric fill material 234 may be provided in the form of any appropriate material which may be removed from the device partially without unduly affecting sensitive device areas, such as the contact regions 252 in the active region 202A. For example, the material 234 may be provided in the form of any appropriate dielectric material, such as silicon dioxide, silicon nitride, silicon oxynitride, polymer materials, when these materials may withstand the process temperatures in the subsequent processing and the like. The material 234 may be provided on the basis of any appropriate deposition process 203, such as a CVD process in which superior gap fill capabilities may be achieved, for instance on the basis of sub-atmospheric CVD, high density plasma CVD and the like. Consequently, the space between the gate electrode structures 220A, 220B and also the recesses 202R in the isolation region 202I may be reliably filled during the deposition process 203. For example, similar processes may be applied as are also used for forming an interlayer dielectric material system on the basis of silicon dioxide, while in other cases well-established deposition regimes for amorphous carbon material, silicon nitride and the like are available and may be used for forming the material 234. In other cases, spin-on techniques in combination with additional material treatment processes may be applied in order to form the material 234.

Figure 2C:
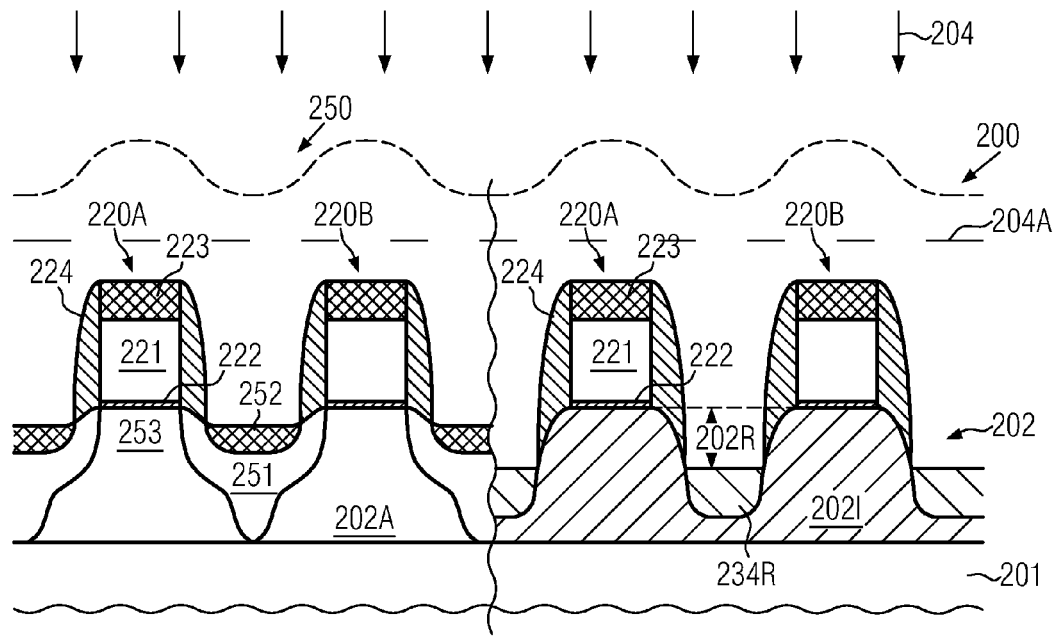

FIG. 2c schematically illustrates the semiconductor device 200 in a further advanced manufacturing stage. As shown, a material removal process 204 may be applied in order to remove a portion of the material 234 (FIG. 2b) from above the active region 202A so as to expose desired areas, such as the contact areas 252. To this end, the removal process 204 may be performed on the basis of well-established plasma assisted etch recipes for removing, for instance, silicon dioxide material selectively with respect to the gate electrode structures 220A and selectively with respect to the contact areas 252. For example, when a metal silicide may be provided in the gate electrode structures 220A, 220B and in the contact areas 252, this material may typically exhibit a moderately high etch resistivity with respect to a plurality of well-established plasma assisted etch recipes. On the other hand, the removal process 204 may be stopped upon exposing the contact areas 252, thereby preserving a part 234R of the previous layer 234 within the recesses 202R, thereby reducing the depth thereof. In other cases, the removal process 204 may comprise wet chemical etch processes which may per se have a high degree of selectivity in order to remove, for instance, materials such as silicon dioxide, silicon nitride selectively with respect to other materials, such as metal silicide, silicon nitride, silicon and the like. In some illustrative embodiments (not shown), a portion of the sidewall spacer structures 224, such as an outermost spacer element (not shown), may be removed during the process 204 when the material of the spacer element has substantially the same etch behavior as the material of the layer 234. In this manner, even superior process conditions may be obtained for the further processing of the device 200, for instance for providing a highly stressed dielectric material, since the stress efficiency may be increased due to the reduced lateral offset of the material from the channel regions 253, while at the same time a less sophisticated topography may be obtained in the isolation region 202I. For example, frequently spacer elements may be provided in the form of a silicon nitride material and hence the layer 234 may be provided in the form of a silicon nitride material or a material having a similar etch characteristic, which may then be removed on the basis of plasma assisted etch recipes, wet chemical etch recipes and the like. At the same time, a significant portion of the spacer structure 224 may also be removed, wherein a corresponding etch stop liner in the spacer structure 224 (not shown) may preserve integrity of the sidewalls of the gate electrode structures 220A, 220B.

In still other illustrative embodiments, the removal process 204 may comprise a planarization process 204A in order to provide superior surface topography, which may be accomplished, for instance, by a CMP process and the like.

Figure 2D:
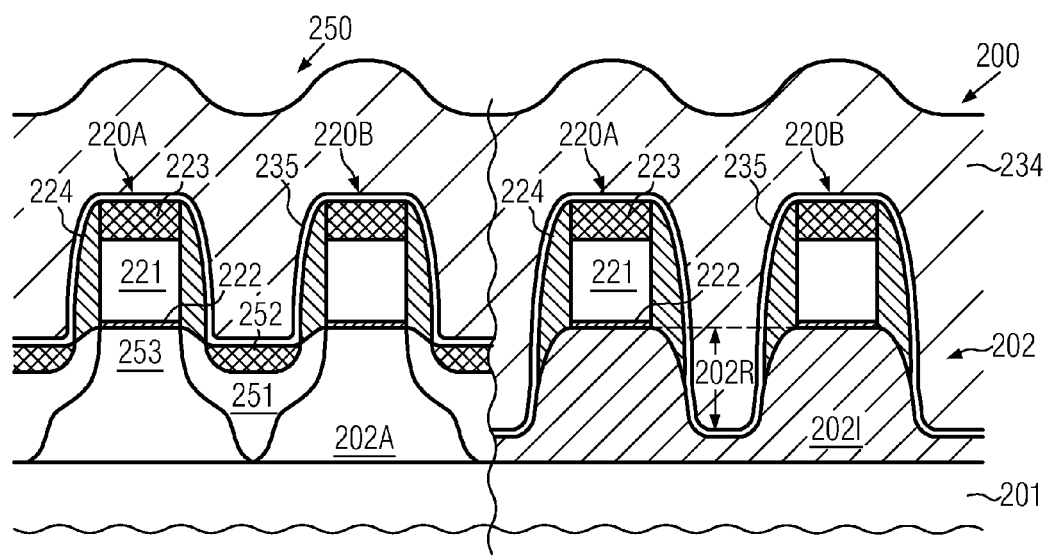
FIGS. 2d-2f schematically illustrate cross-sectional views of the semiconductor device according to further illustrative embodiments in which an additional etch stop material may be used in combination with a fill material.

FIG. 2d schematically illustrates the semiconductor device 200 according to further illustrative embodiments in which superior integrity of the gate electrode structures 220A, 220B and of the active region 202 may be achieved by providing an etch stop layer 235 prior to depositing the material of the layer 234. For example, a plurality of material systems are available which provide a high degree of selectivity during a plurality of etch recipes. For example, silicon dioxide in combination with silicon nitride may be used for the layer system 235, 234, while in other cases silicon nitride and silicon dioxide may be applied. In still other cases, amorphous carbon in combination with silicon oxynitride and the like may be used as an appropriate material system.

Figure 2E:
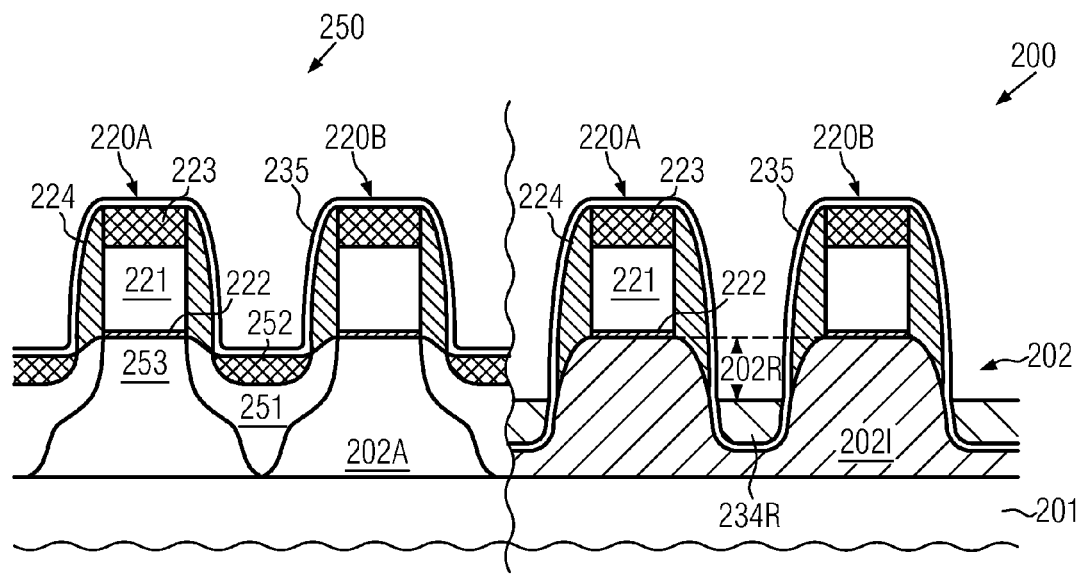

FIG. 2e schematically illustrates the device 200 after the removal process 204 (FIG. 2c), wherein the material of the layer 234 (FIG. 2b) may be completely removed from above the active region 202A, while the residual material 234R may still fill, at least partially, the recesses 202R. Thus, the corresponding removal process may be efficiently controlled on the basis of the stop layer 235 which may thus avoid undue interaction of the reactive etch ambient with sensitive device areas, such as the contact regions 252, the gate electrode structures 220A, 220B and the like.

Figure 2F:
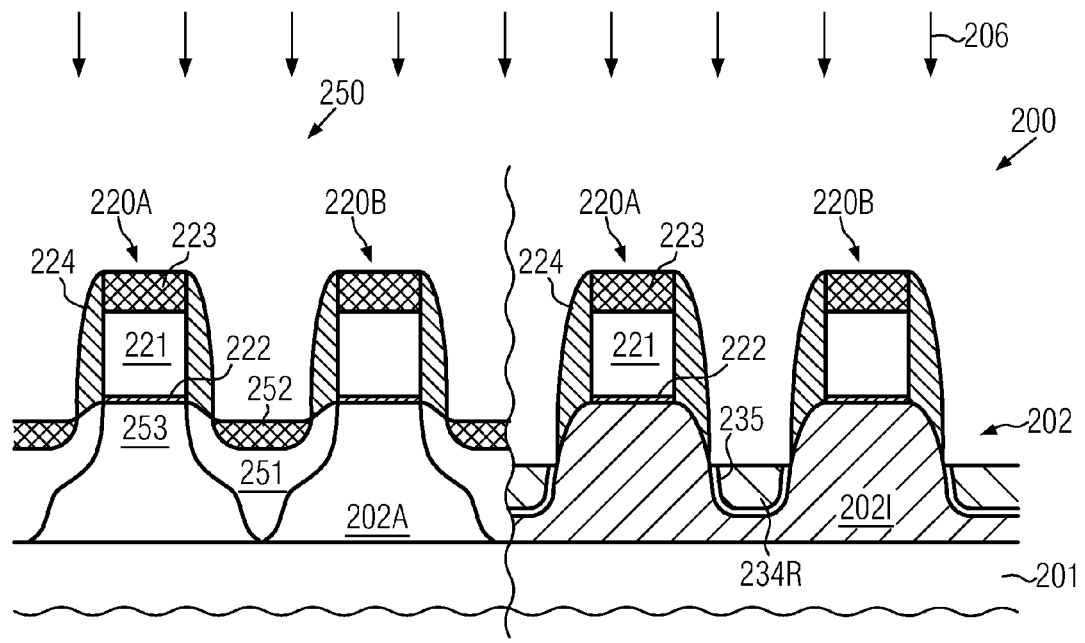

FIG. 2f schematically illustrates the device 200 when exposed to a further reactive etch ambient 206 in which exposed portions of the etch stop layer 235 (FIG. 2e) may be removed in order to appropriately expose surface areas of the active region 202A. Since the etch stop material 235 may be provided with a reduced thickness of approximately 5-20 nm, the etch process 206 may not unduly interact with the sensitive device areas and may also not unduly reduce the material 234R in the recesses of the isolation region 202I. In some illustrative embodiments, the process 206 may also be used to at least reduce the size of the sidewall spacer structures 224 if these structures, or at least an outermost spacer element thereof, may have a similar etch rate or even a higher etch rate compared to the material of the layer 235. For example, if the material 235 is provided as a nitride-based material, a certain reduction in thickness of the spacer structure 224 may be accomplished during the process 206, while still achieving a high degree of controllability of the material removal during the process 206.

On the basis of the device configuration as shown in FIG. 2c or shown in FIG. 2f, the further processing may be continued by forming an interlayer dielectric material system in accordance with the overall device requirements.

Figure 2G:
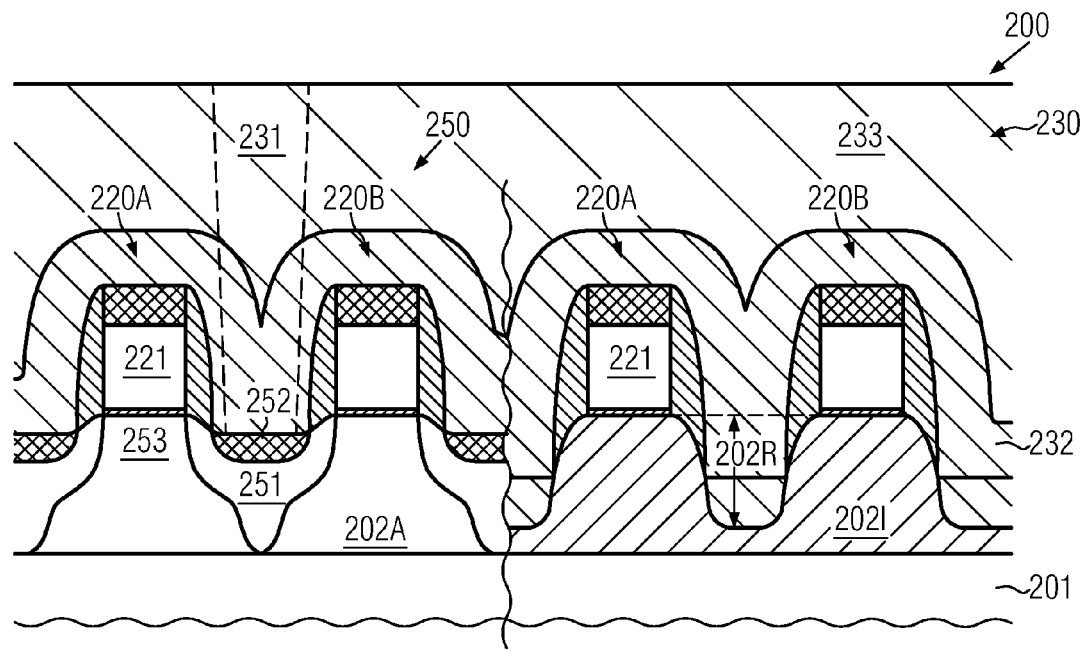
FIG. 2g schematically illustrates a cross-sectional view of the semiconductor device in a further advanced manufacturing stage in which an interlayer dielectric material system may be formed on the basis of a superior surface topography, according to illustrative embodiments.

FIG. 2g schematically illustrates the semiconductor device 200 in a further advanced manufacturing stage. As illustrated, an interlayer dielectric material system 230 may be formed above the active region 202A and the isolation region 202I, wherein, in some illustrative embodiments, at least one strain-inducing material layer 232 may be provided in close proximity to the active region 202A and the gate electrode structures 220A, 220B. For example, as previously discussed, silicon nitride material, nitrogen-containing silicon carbide material and the like may be provided with a high degree of internal stress, wherein a desired layer thickness and high internal stress level may be applied without a significant risk of creating deposition related irregularities due to the similarity in surface topography between the active region 202A and the isolation region 202I.

In other cases, a more complex patterning regime may be applied in order to provide the material layer 232 with different internal stress levels in different device areas, wherein also the superior surface topography in the isolation region 202I may significantly reduce the probability of creating deposition or patterning related irregularities. In the embodiment shown, a further dielectric material 233, for instance in the form of silicon dioxide and the like, may be provided in accordance with requirements of the device 200. The system 230 may be formed on the basis of any appropriate process strategy, as is for instance also previously discussed or as described with reference to the semiconductor device 100. Hence, upon forming contact elements, such as a contact element 231, any appropriate process techniques may be applied to pattern the material system 230, wherein the presence of any buried channels may be significantly reduced compared to conventional strategies, and additional measures may be omitted, such as the provision of an additional dielectric liner material and the like. Consequently, superior contact conductivity may be accomplished for the contact elements 231, while at the same time superior stress conditions may be achieved in the active region 202A, when a strain-inducing dielectric material is provided in the system 230.

It should be appreciated that the concept of depositing a fill material and etching the same so as to provide at least a portion thereof in previously created recesses in the isolation region 202I may be applied at any appropriate manufacturing stage and may even be applied several times in order to obtain a superior surface topography. In the embodiments described above, the provision of the fill material may be implemented such that any material loss causing processes may have already been experienced by the device 200. For instance, the process sequence may be applied after forming any metal silicide materials in the active region 202A, which may typically be associated with a significant material loss due to any pre-silicidation cleaning processes.

Figure 2H:
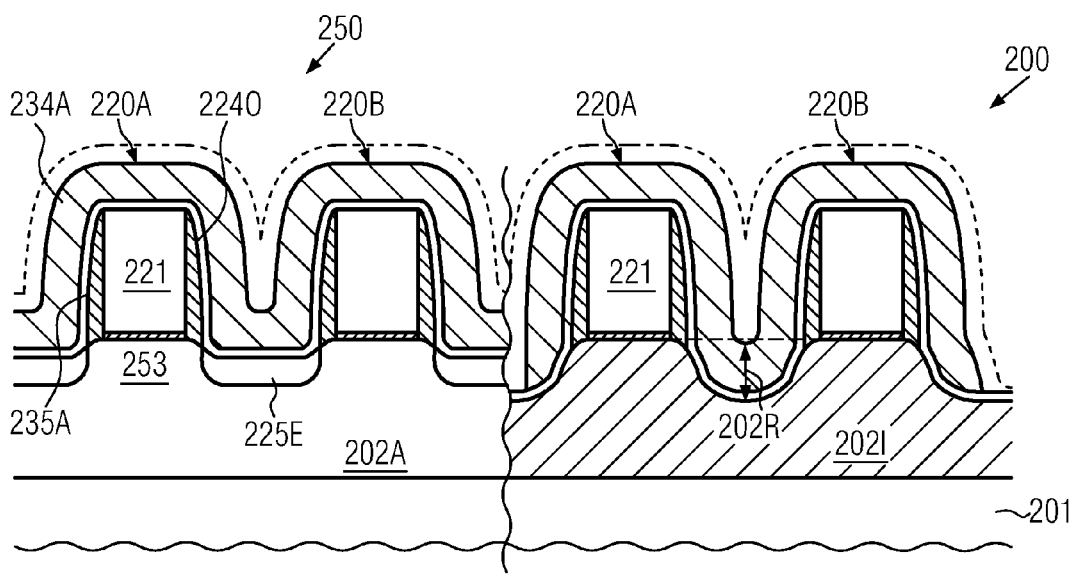
FIGS. 2h-2i schematically illustrate cross-sectional views of the semiconductor device according to still further illustrative embodiments in which the surface topography in the isolation region may be reduced by applying an appropriately designed spacer patterning process.
Figure 2I:
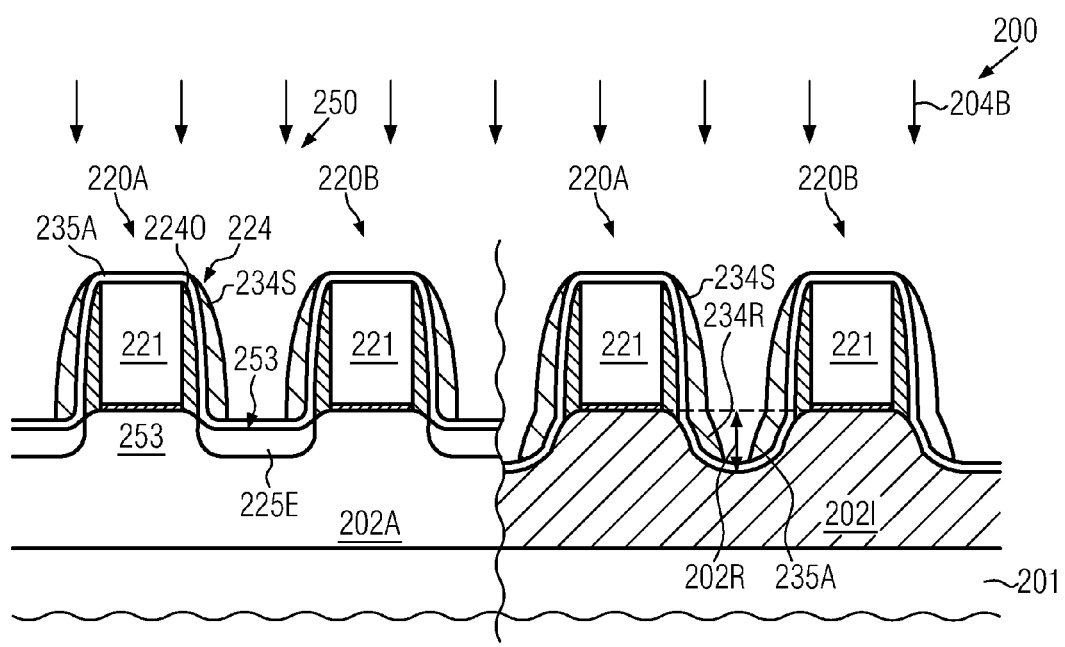

With reference to FIGS. 2h and 2i, further illustrative embodiments will now be described wherein a corresponding process sequence may be applied in an earlier manufacturing stage, however, without adding additional process complexity.

FIG. 2h schematically illustrates the device 200 in a manufacturing stage in which the gate electrode structures 220A, 220B may be provided with an offset spacer element 224O, which may be used for defining the lateral dopant profile of drain and source extension regions 225E within the active region 202A. Thus, in the manufacturing stage shown, any processes for forming deep drain and source areas and metal silicide regions have not yet been performed. Consequently, the recesses 202R in the isolation region 202I may still be present, however, at a less pronounced degree. Moreover, in the manufacturing stage shown, an etch stop liner 235A such as a silicon dioxide material may be provided in combination with a fill material 234A, such as a silicon nitride material. The thickness of the layer 234A may be appropriately selected so as to obtain a desired width of spacer elements after removing a portion of the material 234A. To this end, any appropriate thickness may be selected, as indicated by the dashed line, wherein process parameters may be selected so as to provide superior gap filling capabilities since the internal stress level of the layer 234A may not be a relevant parameter in this process.

FIG. 2i schematically illustrates the device 200 when exposed to an etch process 204B in the form of a plasma assisted etch process in order to remove material of the layer 234A (FIG. 2h) so as to form a spacer element 234S, which may represent an outermost spacer element of the spacer structure 224. Similarly, the spacers 234S may also be formed above the isolation structure 202I, wherein, due to the presence of the recess 202R, also an additional residual material 234R may be preserved, thereby reducing the depth of the recess 202R. It should be appreciated that appropriate process parameters of the etch process 204B may be readily determined on the basis of experiments so that a desired width of the spacer elements 234S may be obtained, while additionally appropriately removing the material of the layer 234A from above the contact areas 253. At the same time, the etch stop layer 235A may preserve integrity of the contact areas 253 and of the gate electrode materials 221 when substantially clearing the contact areas 253. Thereafter, the processing may be continued by using an appropriate masking regime and introducing further drain and source dopant species into the active region 202A by using the spacer elements 234S as an implantation mask. Thereafter, the further processing may be continued by forming a metal silicide, if required, followed by the deposition of the interlayer dielectric material system 230 (FIG. 2g), wherein a material loss may be created in the isolation region 202I, wherein, however, the total surface topography may nevertheless be less pronounced compared to conventional strategies due to the intermediate topography relaxation caused by the process for forming the spacer elements 234S. Consequently, in this case, superior process conditions may be obtained for the formation of an interlayer dielectric material system without adding any additional process steps.

As a result, the present disclosure provides manufacturing techniques and semiconductor devices in which a deposition/etch sequence may be applied at any appropriate manufacturing stage in order to selectively reduce the surface topography in isolation regions of sophisticated semiconductor devices. In some illustrative embodiments, the deposition/etch sequence may be applied immediately prior to depositing the materials of an interlayer dielectric material system, thereby compensating for or at least reducing the effects of a combined material loss in the isolation structure, which may have accumulated over the entire process flow. In other illustrative embodiments, at any earlier manufacturing stage, for instance upon forming spacer elements and the like, a corresponding sequence may be applied in order to reduce the overall surface topography. In still other illustrative embodiments, the deposition/etch sequence may be applied two times or more, for instance by combining the processes as described with reference to FIGS. 2h and 2i for forming a spacer element and performing an additional deposition/etch sequence immediately prior to the deposition of the interlayer dielectric material system. Consequently, the probability of creating contact failures due to buried leakage paths may be significantly reduced without compromising overall performance of sophisticated semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a first dielectric material layer above a semiconductor region and an isolation region, said semiconductor region and said isolation region having formed thereon one or more conductive lines, said isolation region comprising recesses, wherein said first dielectric material layer is formed prior to forming drain and source regions in said semiconductor region;
    performing a first removal process so as to remove said first dielectric material layer at least from above a portion of said semiconductor region and to preserve a part of said first dielectric material layer in said recesses of said isolation region;
    forming said drain and source regions in said semiconductor region;
    after forming said drain and source regions, forming a second dielectric material layer above said semiconductor region and said isolation region;
    performing a second removal process so as to remove said second dielectric material layer at least from above a second portion of said semiconductor region and to preserve a part of said second dielectric material layer in said recesses of said isolation region; and
    forming an interlayer dielectric material system above said semiconductor region and said isolation region after performing said second removal process.

2. The method of claim 1, further comprising forming a metal silicide at least in said portion of said semiconductor region after forming said first dielectric material layer.

3. The method of claim 1, further comprising forming an etch stop layer above said semiconductor region and said isolation region prior to forming said first dielectric material layer.

4. The method of claim 1, wherein performing said first removal process comprises preserving sidewall spacers on sidewalls of said one or more conductive lines above said semiconductor region.

5. The method of claim 4, further comprising forming at least one of drain and source regions and a metal silicide in said semiconductor region by using said sidewall spacer as a mask.

6. The method of claim 1, wherein forming said interlayer dielectric material system comprises forming at least one strain-inducing layer above said semiconductor region and said isolation region.

7. The method of claim 1, wherein performing said first removal process comprises performing a planarization process.

8. A method, comprising:
    performing a process sequence so as to form a plurality of gate electrode structures of a semiconductor device above a semiconductor region and an isolation region, said process sequence resulting in a plurality of recesses due to material loss in exposed areas of said isolation region;
    prior to forming drain and source regions in said semiconductor region, forming a first dielectric fill material above and between said plurality of gate electrode structures;
    removing a portion of said first dielectric fill material from above said semiconductor region and said isolation region so as to remove said first dielectric fill material at least from above a portion of said semiconductor region and to preserve a part of said first dielectric fill material in said recesses in said isolation region;
    after removing said portion of said first dielectric material, forming said drain and source regions in said semiconductor region;
    after forming said drain and source regions, forming a second dielectric material layer above said semiconductor region and said isolation region;
    removing a portion of said second dielectric material layer at least from above a second portion of said semiconductor region and to preserve a part of said second dielectric material layer in said recesses of said isolation region above said preserved portions of said first dielectric material;
    after removing said portion of said second dielectric material, forming an interlayer dielectric material system above said semiconductor region and said isolation region.

9. The method of claim 8, comprising forming a metal silicide in said drain and source regions after forming said dielectric fill material.

10. The method of claim 8, wherein removing a portion of said first dielectric fill material comprises forming a sidewall spacer on sidewalls of said plurality of gate electrode structures.

11. The method of claim 8, wherein forming said interlayer dielectric material system comprises forming a strain-inducing layer above and between said plurality of gate electrode structures.

12. The method of claim 8, wherein forming said plurality of gate electrode structures comprises applying a critical dimension of 50 nm or less.

* * * * *

UNITED STATES PATENT AND TRADEMARK OFFICE
CERTIFICATE OF CORRECTION

PATENT NO.       : 8,722,511 B2           Page 1 of 1
APPLICATION NO.  : 13/154754
DATED            : May 13, 2014
INVENTOR(S)      : Richter et al.

It is certified that error appears in the above-identified patent and that said Letters Patent is hereby corrected as shown below:

In the Claims:

In claim 9, at column 16, line 53, before "comprising", insert -- further --.

Signed and Sealed this
Fifteenth Day of July, 2014

Michelle K. Lee
*Deputy Director of the United States Patent and Trademark Office*